(12) United States Patent
Miyake et al.

(10) Patent No.: US 9,459,525 B2
(45) Date of Patent: Oct. 4, 2016

(54) CURABLE COMPOSITION FOR NANOIMPRINTING AND CURED PRODUCT

(75) Inventors: Hiroto Miyake, Himeji (JP); Takao Yukawa, Himeji (JP); Shuso Iyoshi, Himeji (JP)

(73) Assignee: DAICEL CHEMICAL INDUSTRIES, LTD., Osaka-Shi (JP)

( * ) Notice: Subject to any disclaimer, the term of this patent is extended or adjusted under 35 U.S.C. 154(b) by 1319 days.

(21) Appl. No.: 13/259,786

(22) PCT Filed: Mar. 16, 2010

(86) PCT No.: PCT/JP2010/054427
§ 371 (c)(1),
(2), (4) Date: Sep. 23, 2011

(87) PCT Pub. No.: WO2010/110121
PCT Pub. Date: Sep. 30, 2010

(65) Prior Publication Data
US 2012/0021180 A1    Jan. 26, 2012

(30) Foreign Application Priority Data
Mar. 24, 2009 (JP) ................. 2009-071168

(51) Int. Cl.
*G03F 7/027* (2006.01)
*C09D 4/00* (2006.01)
*C08F 20/68* (2006.01)
*C08F 220/18* (2006.01)
*C08F 220/30* (2006.01)
*C08F 220/40* (2006.01)
*C08L 25/04* (2006.01)
*C08L 29/10* (2006.01)
*C08L 33/08* (2006.01)
*C08L 33/10* (2006.01)
*G03F 7/00* (2006.01)
*B82Y 10/00* (2011.01)
*B82Y 40/00* (2011.01)
*G03F 7/26* (2006.01)

(52) U.S. Cl.
CPC ............. *G03F 7/0002* (2013.01); *B82Y 10/00* (2013.01); *B82Y 40/00* (2013.01); *C09D 4/00* (2013.01); *G03F 7/027* (2013.01); *C08F 220/30* (2013.01); *C08F 220/40* (2013.01); *Y10T 428/24479* (2015.01)

(58) Field of Classification Search
CPC .... C08F 220/30; C08F 220/40; C08F 20/68; C08F 220/18; C09D 4/00; C08L 25/04; C08L 29/10; C08L 33/08; C08L 33/10
See application file for complete search history.

(56) References Cited

U.S. PATENT DOCUMENTS

| | | | |
|---|---|---|---|
| 5,772,905 A | 6/1998 | Chou | |
| 6,916,508 B2 * | 7/2005 | Adachi et al. | 427/508 |
| 8,530,540 B2 | 9/2013 | Kodama | |
| 2003/0011092 A1 * | 1/2003 | Tan et al. | 264/51 |
| 2007/0160937 A1 | 7/2007 | Ogino et al. | |
| 2010/0009287 A1 | 1/2010 | Kodama | |

FOREIGN PATENT DOCUMENTS

| | | |
|---|---|---|
| CN | 101105625 A | 1/2008 |
| JP | 2003-297722 A | 10/2003 |
| JP | 2004-59822 A | 2/2004 |
| JP | 2006-5109 A | 1/2006 |
| JP | 2007-1250 A | 1/2007 |
| JP | 2007-186570 A | 7/2007 |
| JP | 2008-19292 A | 1/2008 |
| JP | 2008-84984 A | 4/2008 |
| JP | 2009-51017 A | 3/2009 |
| JP | 2009-203287 A | 9/2009 |
| JP | 2010-612 A | 1/2010 |
| JP | 2010-37541 A | 2/2010 |

OTHER PUBLICATIONS

International Search Report for PCT/JP2010/054427, mailed on Jun. 29, 2010.
Japanese Office Action for Japanese Application No. 2011-505985, dated Jun. 25, 2013 with English translation.

\* cited by examiner

*Primary Examiner* — Fred M Teskin
(74) *Attorney, Agent, or Firm* — Birch, Stewart, Kolasch & Birch, LLP

(57) ABSTRACT

Disclosed is a curable composition for nanoimprinting, which includes one or more polymerizable monomers, in which one or more monofunctional radically polymerizable monomers occupy 90 percent by weight or more of the one or more polymerizable monomers, and the one or more monofunctional radically polymerizable monomers give a polymer having a glass transition temperature of 25° C. or higher. The one or more monofunctional radically polymerizable monomers are preferably at least one compound selected from (meth)acrylic ester compounds, styrenic compounds, and vinyl ether compounds.

5 Claims, No Drawings

CURABLE COMPOSITION FOR NANOIMPRINTING AND CURED PRODUCT

TECHNICAL FIELD

The present invention relates to a curable composition for nanoimprinting, a cured product thereof, a method for producing a fine structure using the curable composition for nanoimprinting, and a fine structure obtained by the production method, which curable composition is suitable particularly for the producing of a fine structure using a nanoimprinting technique out of microlithography techniques.

BACKGROUND ART

The miniaturization of electronic components, for which a resolution down to the range of less than 1 µm is required, has been achieved substantially by photolithographic techniques. For a further higher resolution, miniaturization is being achieved by the progress of immersion lithography technologies using ArF having a short exposure wavelength as a light source. However, such technologies for forming a pattern with a line width of 32 nm or less have more and more suffered from problems such as line edge roughness depending on the physical properties of a resin to be used. On the other hand, the higher and higher requirements with respect to resolution, wall slope, and aspect ratio (ratio of height to resolution) result in a cost explosion in the case of masks, mask aligners, steppers, and other apparatuses required for photolithographic structuring. Among them, owing to their very high price, modern steppers are a considerable cost factor in microchip production as a whole. Independently, there is an attempt to use short-wave radiation, such as electron beams and X-rays, for achieving a higher resolution. However, this technique still has many problems when adopted to mass production.

Liquid crystal displays each generally employ two or more functional films typically including a light guide, a prism sheet, a deflector plate, and an anti-reflection film for satisfactory viewing angle and high brightness. However, to obtain these functions using films composed of a thermoplastic film, it is necessary that the thermoplastic resin is heated to a temperature around its glass transition temperature Tg, a pattern is transferred thereto, the patterned thermoplastic resin is cooled to room temperature, from which the mold is removed, and these operations cause a problem in throughput. In contrast, a thermal imprinting technique through coating allows curing to be easily performed at lower temperatures and thereby enables a higher throughput. UV-based nanoimprint lithography (UV-NIL) is a technique according to which patterning is performed by applying a liquid photocurable resin to a substrate at room temperature; stamping an optically transparent mold onto the applied resin; and applying an ultraviolet ray (UV) to cure the resin on the substrate to form a pattern. This technique enables pattern transfer at room temperature and is expected typically for (i) a high throughput and (ii) pattern transfer with high resolution or definition. However, if the expensive mold is contaminated with the liquid UV-NIL material during microprocessing, it is very difficult to recycle or reuse the mold, because the liquid UV-NIL material is cured through UV curing into a solid that is insoluble in solvents.

U.S. Pat. No. 5,772,905 discloses a nanoimprinting process as a process for forming a fine convexo-concave pattern on a film. This process applies thermoplastic deformation to a resist using a relief-formed rigid stamp, which resist is applied to the entire surface of a substrate (wafer) and is composed of a thermoplastic resin. This process employs a thermoplastic resin (poly(methyl methacrylate), PMMA) as a hot-stamping resist. However, owing to common thickness variations of about 100 nm over the entire wafer surface, it is not possible to structure a 6-, 8-, or 12-inch wafer in one step with a rigid stamp. Thus, a complicated "step and repeat" method would have to be used, which, however, is unsuitable in consideration of production process, owing to the reheating of already structured neighboring areas.

Japanese Unexamined Patent Application Publication (JP-A) No. 2007-186570 discloses, as a process for forming a fine pattern through UV-based nanoimprinting, a process of using a composition which contains a (meth)acrylate monomer having an alicyclic functional group and shows satisfactory dry etching resistance. This process, however, still suffers from a problem that a cured product of the composition is difficult to be removed from the mold when the mold is contaminated with the composition, because the multifunctional monomer has been three-dimensionally cured.

Japanese Unexamined Patent Application Publication (JP-A) No. 2007-1250 reports another nanoimprinting technique as a process for forming a fine pattern through nanoimprinting, in which a fluorocarbon polymer is used for improved mold releasability. This technique reduces the frequency of mold contamination but still insufficiently, and the problem in removal of the cured product upon mold contamination still remains as a significant problem.

Independently, an imprinting technique using an alkali-developable resist enables mold recycling or reusing. However, though being effective typically for peeling off of the cured article (fine pattern) from the mold, the alkali-developable resist is very difficult to be removed from the fine pattern through dissolution, because a resin constituting the resist is not thoroughly dissolved in an alkali but is suspended therein.

CITATION LIST

Patent Literature

PTL 1: U.S. Pat. No. 5,772,905
PTL 2: Japanese Unexamined Patent Application Publication (JP-A) No. 2007-186570
PTL 3: Japanese Unexamined Patent Application Publication (JP-A) No. 2007-1250

SUMMARY OF INVENTION

Technical Problem

An object of the present invention is to provide a curable composition for nanoimprinting which has sufficient curability, gives a cured product having satisfactory mold releasability (releasability from a mold such as a transfer imprint stamp, a master mold, or a replica mold as a transfer target), and has satisfactory transferability, in which the cured product can be dissolved and thereby removed by the action of an organic solvent or aqueous alkali solution according to necessity. Another object of the present invention is to provide a cured product obtained from the curable composition; a method for producing a fine structure using the curable composition for nanoimprinting, and a fine structure produced by the method.

Solution to Problem

After intensive investigations to achieve the objects, the present inventors have found that a specific composition, when used as a curable composition for nanoimprinting, has sufficient curability, satisfactory mold releasability of a cured product thereof, and excellent transferability, in which the cured product can be dissolved and thereby removed by the action of an organic solvent or aqueous alkali solution according to necessity, which specific composition contains at least one polymerizable monomer, in which the polymerizable monomer includes 90 percent by weight or more of one or more monofunctional radically polymerizable monomers, and the one or more monofunctional radically polymerizable monomers give a polymer having a glass transition temperature of 25° C. or higher. The present invention has been made based on these findings.

Specifically, the present invention provides, in an aspect, a curable composition for nanoimprinting, comprising one or more polymerizable monomers, wherein the one or more polymerizable monomers includes 90 percent by weight or more of one or more monofunctional radically polymerizable monomers, and wherein the one or more monofunctional radically polymerizable monomers give a polymer having a glass transition temperature of 25° C. or higher.

The one or more monofunctional radically polymerizable monomers may be at least one compound selected from the group consisting of (meth)acrylic ester compounds, styrenic compounds, and vinyl ether compounds.

At least one radically polymerizable monomer intramolecularly having a cyclic structure is preferably used as the one or more monofunctional radically polymerizable monomers. The radically polymerizable monomer intramolecularly having a cyclic structure may be at least one compound selected from the group consisting of compounds represented by following Formulae (1) to (3):

[Chem. 1]

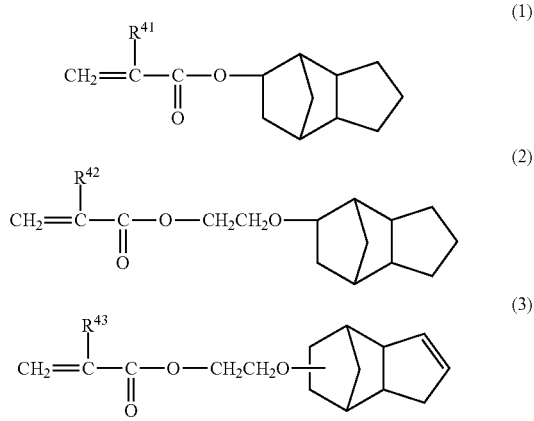

wherein $R^{41}$, $R^{42}$, and $R^{43}$ are the same as or different from one another and each represent —H or —CH$_3$.

At least one radically polymerizable monomer having a hydrophilic group is also preferably used as the monofunctional radically polymerizable monomers. Exemplary hydrophilic groups in the radically polymerizable monomer having a hydrophilic group include hydroxyl groups, carboxyl groups, quaternary ammonium groups, amino groups, and heterocyclic groups.

The curable composition for nanoimprinting may further include a polymer being obtained through polymerization of one or more monofunctional radically polymerizable monomers and having a glass transition temperature of 25° C. or higher.

The curable composition for nanoimprinting may further include a radical-polymerization initiator.

The present invention provides, in another aspect, a cured product obtained through curing of the curable composition for nanoimprinting.

The present invention further provides, in yet another aspect, a method for producing a fine structure, the method including the step of subjecting the curable composition for nanoimprinting to give a fine structure.

The method for producing a fine structure may include the steps of (1) forming on a substrate a film from the curable composition for nanoimprinting; (2) stamping an imprint stamp onto the film to transfer a pattern to the film; and (3) curing the pattern-transferred film to give a fine structure.

The imprint stamp used in Step (2) may be composed of at least one selected from the group consisting of a silicone, glass, and silica glass as a material.

The method may include, as Steps (2) and (3), the step of stamping the imprint stamp onto the film at a pressure of 10 kPa to 100 MPa for 0.01 to 300 seconds to transfer the pattern to the film and simultaneously applying heating and/or ultraviolet irradiation to the film to cure the film, to thereby give a fine structure.

The method for producing a fine structure may further include the step of (4) etching the cured film; and/or may further include the step of (5) forming, on the resulting fine structure, a second structure from another material than that of the fine structure and subsequently removing the fine structure to give a three-dimensional fine structure. The removal of the fine structure may be performed by dissolving the fine structure in a solvent or alkaline developer which dissolves not the second structure but the fine structure.

The present invention provides, in still another aspect, a fine structure produced by the method.

Examples of the fine structure include materials for semiconductor devices, materials for micro-electric-mechanical systems, flat screens, holograms, waveguides, precision machinery components, sensors, and molds for the production of replica molds.

Advantageous Effects of Invention

Curable compositions for nanoimprinting according to the present invention each have sufficient curability and satisfactory mold releasability of a cured product thereof and show excellent transferability, in which the cured product can be dissolved and thereby removed by the action of an organic solvent or aqueous alkali solution (alkaline developer). The curable compositions are useful as a resist for microstructuring of materials for semiconductor devices, materials for micro-electric-mechanical systems (MEMS), flat screens, holograms, waveguides, precision machinery components, sensors, or molds for the production of replica molds.

DESCRIPTION OF EMBODIMENTS

Curable compositions for nanoimprinting according to the present invention each contain one or more polymerizable monomers. A variety of monomers may be used as the polymerizable monomers herein, but it is important that the polymerizable monomers include 90 percent by weight or more (preferably 95 percent by weight or more) of one or more monofunctional (having only one radically reactive unsaturated group) radically polymerizable monomers; and that the one or more monofunctional radically polymerizable monomers give a polymer having a glass transition temperature of 25° C. or higher (preferably 40° C. or higher). The curable composition, if containing monofunctional radically polymerizable monomers in an excessively small amount and containing multifunctional radically polymerizable monomers in an excessively large amount, gives a cured product being inferior in mold releasability, solubility in a solvent, and solubility in an alkaline developer, and this impedes the removal of the cured product from the mold, to which the cured product has adhered. If the one or more monofunctional radically polymerizable monomers give a polymer having a glass transition temperature of lower than 25° C., the cured product shows insufficient transferability and mold releasability, and the curable composition may be cured insufficiently.

Exemplary monofunctional radically polymerizable monomers include (meth)acrylic acid alkyl esters [e.g., (meth)acrylic acid alkyl esters whose alkyl moiety having 1 to 10 carbon atoms], such as methyl (meth)acrylate, ethyl (meth)acrylate, propyl (meth)acrylate, butyl (meth)acrylate, pentyl (meth)acrylate, and hexyl (meth)acrylate; (meth) acrylic esters each intramolecularly having a cyclic structure (aliphatic cyclic structure or aromatic cyclic structure), such as benzyl (meth)acrylate, cyclohexyl (meth)acrylate, cyclopentyl (meth)acrylate, adamantyl (meth)acrylate, isobornyl (meth)acrylate, dicyclopentanyl (meth)acrylate, dicyclopentenyl (meth)acrylate, 2-(dicyclopentenyloxy)ethyl (meth) acrylate, and 2-(dicyclopentanyloxy)ethyl (meth)acrylate; styrenic compounds such as styrene, vinyltoluene, and α-methylstyrene; and vinyl ether compounds such as methyl vinyl ether, butyl vinyl ether, and phenyl vinyl ether.

Exemplary monofunctional radically polymerizable monomers further include radically polymerizable monomers each having a hydrophilic group. Exemplary hydrophilic groups include hydroxyl group, carboxyl group, quaternary ammonium group, amino group, and heterocyclic groups. Specific examples of radically polymerizable monomers each having a hydrophilic group include compounds each having a phenolic hydroxyl group, such as hydroxystyrene; hydroxyl-containing (meth)acrylic esters such as 2-hydroxyethyl (meth)acrylate, hydroxypropyl (meth)acrylate, hydroxybutyl (meth)acrylate, and caprolactone-modified 2-hydroxyethyl (meth)acrylate; alkoxypolyalkylene glycol (meth)acrylates such as methoxydiethylene glycol (meth) acrylate, ethoxydiethylene glycol (meth)acrylate, isooctyloxydiethylene glycol (meth)acrylate, phenoxytriethylene glycol (meth)acrylate, methoxytriethylene glycol (meth) acrylate, and methoxypolyethylene glycol (meth)acrylates; carboxyl-containing monomers such as (meth)acrylic acid and β-carboxyethyl (meth)acrylate; lactone-modified derivatives of unsaturated carboxylic acids, such as ε-caprolactone adduct of (meth)acrylic acid; compounds corresponding to the hydroxyl-containing monomers, except for the addition of an acid anhydride; amino-containing (meth) acrylic esters such as 2-aminoethyl (meth)acrylate; and heterocyclic compounds (e.g., nitrogen-containing heterocyclic compounds) each having a vinyl group, such as 2-vinylpyrrolidone.

Among them, preferred as monofunctional radically polymerizable monomers are radically polymerizable monomers each intramolecularly having a cyclic structure and giving a homopolymer having a high glass transition temperature, such as the (meth)acrylic esters each intramolecularly having a cyclic structure (aliphatic cyclic structure or aromatic cyclic structure); of which more preferred are (meth)acrylic esters each having a bridged skeleton, such as dicyclopentanyl (meth)acrylate, dicyclopentenyl (meth) acrylate, 2-(dicyclopentenyloxy)ethyl (meth)acrylate, and 2-(dicyclopentanyloxy)ethyl (meth)acrylate. Above all, dicyclopentanyl methacrylates represented by Formula (1), dicyclopentanyloxyethyl methacrylates represented by Formula (2), and dicyclopentenyloxyethyl methacrylates represented by Formula (3) are particularly preferred. Independently, radically polymerizable monomers each having a hydrophilic group are also preferred as monofunctional radically polymerizable monomers.

In an embodiment of the present invention, a curable composition contains a relatively large amount of one or more radically polymerizable monomers each containing a hydrophilic group (of which a phenolic hydroxyl group, a carboxyl group, and/or a heterocyclic group is preferred). This curable composition gives a cured product which is readily soluble in an alkaline developer. In this case, the curable composition may contain one or more radically polymerizable monomers in a content typically of 10 percent by weight or more based on the total weight of polymerizable monomers. In another embodiment, a curable composition contains a relatively small amount of one or more radically polymerizable monomers containing a hydrophilic group (of which a phenolic hydroxyl group, a carboxyl group, and/or a heterocyclic group is preferred). This curable composition gives a cured product which is readily soluble in an organic solvent. In this case, the curable composition may contain one or more radically polymerizable monomers in a content typically of less than 10 percent by weight based on the total weight of polymerizable monomers. Examples of the organic solvent include cyclic ethers such as tetrahydrofuran and dioxane; ketones such as methyl ethyl ketone and cyclohexanone; glycol ethers such as Cellosolve (ethylene glycol monoethyl ether), methyl Cellosolve (ethylene glycol monomethyl ether), Carbitol (diethylene glycol monoethyl ether), methyl Carbitol (diethylene glycol monomethyl ether), butyl Carbitol (diethylene glycol monobutyl ether), propylene glycol monomethyl ether, dipropylene glycol monomethyl ether, dipropylene glycol monoethyl ether, and triethylene glycol monoethyl ether; acetic esters such as ethyl acetate, butyl acetate, Cellosolve acetate (ethylene glycol monoethyl ether acetate), butyl Cellosolve acetate (ethylene glycol monobutyl ether acetate), Carbitol acetate (diethylene glycol ethyl ether acetate), butyl Carbitol acetate (diethylene glycol butyl ether acetate), and propylene glycol monomethyl ether acetate; and alcohols such as ethanol, propanol, ethylene glycol, and propylene glycol.

The one or more monofunctional radically polymerizable monomers herein are chosen so that they give a polymer having a glass transition temperature of 25° C. or higher (e.g., from 25° C. to 220° C.) and particularly preferably 40° C. or higher (e.g., from 40° C. to 220° C.). The glass transition temperature of the polymer may be determined by calculation according to a known procedure. The glass transition temperature may also be determined by differential scanning calorimetry (DSC).

Particularly preferred embodiments of curable compositions for nanoimprinting according to the present invention include (1) a curable composition in which one or more monofunctional (meth)acrylic esters each intramolecularly having a cyclic structure (of which an aliphatic cyclic structure is preferred) occupy 40 percent by weight or more, more preferably 50 percent by weight or more, and particularly preferably 60 percent by weight or more, of the total weight of polymerizable monomers in the curable composition; (2) a curable composition in which one or more monomers selected from the group consisting of phenolic-hydroxyl-containing monofunctional radically polymerizable monomers, carboxyl-containing monofunctional radically polymerizable monomers, and heterocyclic-group-containing monofunctional radically polymerizable monomers occupy 10 percent by weight or more, more preferably 15 percent by weight or more, and particularly preferably 20 percent by weight or more, of the total weight of polymerizable monomers in the curable composition; and (3) a curable composition which contains one or more monofunctional (meth)acrylic esters each intramolecularly having a cyclic structure [of which monofunctional (meth)acrylic esters each intramolecularly having an aliphatic cyclic structure (particularly a bridged skeleton) are preferred], in which one or more monomers selected from the group consisting of phenolic-hydroxyl-containing monofunctional radically polymerizable monomers, carboxyl-containing monofunctional radically polymerizable monomers, and heterocyclic-group-containing monofunctional radically polymerizable monomers occupy 10 percent by weight or more, more preferably 15 percent by weight or more, and particularly preferably 20 percent by weight or more, of the total weight of polymerizable monomers in the curable composition.

In an embodiment of the present invention, a curable composition for nanoimprinting may further contain a polymer which is obtained through polymerization of one or more monofunctional radically polymerizable monomers and which has a glass transition temperature of 25° C. or higher (e.g., from 25° C. to 220° C.), and preferably 40° C. or higher (e.g., from 40° C. to 220° C.). The composition, by containing such a polymer, may exhibit higher coatability.

The one or more monofunctional radically polymerizable monomers as monomers for constituting the polymer may be those listed above.

The curable composition may contain the polymer in a content of generally from about 0 to about 60 percent by weight (e.g., from about 3 to about 60 percent by weight), preferably from about 0 to about 50 percent by weight (e.g., from about 3 to about 50 percent by weight), and more preferably from about 0 to about 40 percent by weight (e.g., 5 to about 40 percent by weight), based on the total weight of the monofunctional radically polymerizable monomers and the polymer.

In another embodiment of the present invention, a curable composition for nanoimprinting may further contain a radical-polymerization initiator. Exemplary radical-polymerization initiators include benzoin and benzoin alkyl ethers such as benzoin, benzoin methyl ether, benzoin ethyl ether, and benzoin isopropyl ether; acetophenones such as acetophenone, 2,2-dimethoxy-2-phenylacetophenone, 2,2-diethoxy-2-phenylacetophenone, 1,1-dichloroacetophenone, 2-methyl-1-[4-(methylthio)phenyl]-2-morpholino-propan-1-one, and 2-benzyl-2-dimethylamino-1-(4-morpholinophenyl)-butan-1-one; anthraquinones such as 2-methylanthraquinone, 2-ethylanthraquinone, 2-tert-butylanthraquinone, 1-chloroanthraquinone, and 2-amylanthraquinone; thioxanthones such as 2,4-dimethylthioxanthone, 2,4-diethylthioxanthone, 2-chlorothioxanthone, and 2,4-isopropylthioxanthone; ketals such as acetophenone dimethyl ketal and benzyl dimethyl ketal; benzophenones such as benzophenone; xanthones; 1,7-bis(9-acridinyl)heptane; and other known or customary photoinitiators. Each of different photoinitiators may be used alone or in combination.

Each of these radical-polymerization initiators may be used in combination with one or more known or common photosensitizers. Exemplary photosensitizers include tertiary amines such as ethyl N,N-dimethylaminobenzoate, isoamyl N,N-dimethylaminobenzoate, pentyl 4-dimethylaminobenzoate, triethylamine, and triethanolamine.

Exemplary commercially available radical-polymerization initiators include photoinitiators including those of Irgacure (registered trademark) type each available from Ciba (now part of BASF), such as Irgacure (registered trademark) 184 (1-hydroxycyclohexyl phenyl ketone) and Irgacure (registered trademark) 500 (a mixture of 1-hydroxycyclohexyl phenyl ketone and benzophenone); and Darocur (registered trademark) 1173, 1116, 1398, 1174, and 1020 each available from Merck. Independently, examples of thermal (polymerization) initiators suitable for use herein include organic peroxides, of which preferred are organic peroxides in the form of diacyl peroxides, peroxydicarbonates, alkyl peresters, dialkyl peroxides, perketals, ketone peroxides, and alkyl hydroperoxides. Specific examples of such thermal initiators include dibenzoyl peroxide, t-butyl perbenzoate, and azobisisobutyronitrile.

In yet another embodiment of the present invention, a curable composition for nanoimprinting may contain one or more fluorochemical or silicone surfactants. Among them, fluorochemical surfactants are effective for improved mold releasability, thus being preferred. Of fluorochemical surfactants (fluorine-containing surfactants), preferred are anionic fluorine-containing surfactants, cationic fluorine-containing surfactants, amphoteric fluorine-containing surfactants, or nonionic fluorine-containing surfactants. These fluorine-containing surfactants may be either hydrophobic or water-soluble. Typically, exemplary anionic fluorine-containing surfactants include Surflon S-111 (supplied by AGC Seimi Chemical Co., Ltd.), Fluora FC-143 (supplied by Minnesota Mining & Manufacturing Co. (3M)), and Megafac F-114 (supplied by DIC Corporation). Exemplary cationic fluorine-containing surfactants include Surflon S-121 (supplied by AGC Seimi Chemical Co., Ltd.), Fluora FC-134 (supplied by 3M), and Megafac F-150 (supplied by DIC Corporation). Exemplary amphoteric fluorine-containing surfactants include Surflon S-132 (supplied by AGC Seimi Chemical Co., Ltd.), Fluora FX-172 (supplied by 3M), and Megafac F-120 (supplied by DIC Corporation). Exemplary nonionic fluorine-containing surfactants include Surflon S-145, S-393, KH-20, and KH-40 (supplied by AGC Seimi Chemical Co., Ltd.), Fluorad FC-170 and FC-430 (supplied by 3M), and Megafac F-141 (supplied by DIC Corporation). Silicone surfactants for use herein may be any of known silicone surfactants.

Where necessary, a curable composition for nanoimprinting according to the present invention may further contain any of, for example, resins (binder resins) other than the above resin, monomers, oligomers, sensitizers, and nanoscale particles (nanoparticles).

A method for producing a fine structure according to the present invention applies nanoimprinting to the curable composition for nanoimprinting according to the present invention and thereby yields a fine structure. More specifically, the method according to the present invention includes the steps of (1) forming on a substrate a film from the curable composition for nanoimprinting according to the present invention; (2) stamping an imprint stamp onto the film to transfer a pattern to the film; and (3) curing the pattern-transferred film to give a fine structure.

Examples of the substrate (support, carrier) to which the curable composition is applied in Step (1) include glass, silica glass, plastic films, and silicon wafers. Each of these substrates may have an adhesion promoting film on its surface. The adhesion promoting film may be formed from an organic polymer which helps the substrate to have sufficient wetting with respect to the resin composition (curable composition). Exemplary organic polymers for constituting the adhesion promoting film include aromatic-compound-containing polymers or copolymers each containing novolaks, styrenes, (poly)hydroxystyrenes and/or (meth)acrylates. The adhesion promoting film may be formed by applying a solution containing the organic polymer to the substrate according to a known procedure such as spin coating.

The curable composition for nanoimprinting may be applied (coated) as intact or as a solution in an organic solvent. By using the organic solvent, the composition is diluted into a paste, the paste easily undergoes a coating process, and the applied paste is then dried to form a film which enables contact exposure. Exemplary organic solvents for use herein include ketones such as methyl ethyl ketone and cyclohexanone; aromatic hydrocarbons such as toluene, xylenes, and tetramethylbenzene; glycol ethers such as Cellosolve, methyl Cellosolve, Carbitol, methyl Carbitol, butyl Carbitol, propylene glycol monomethyl ether, dipropylene glycol monomethyl ether, dipropylene glycol monoethyl ether, and triethylene glycol monoethyl ether; acetic esters such as ethyl acetate, butyl acetate, Cellosolve acetate, butyl Cellosolve acetate, Carbitol acetate, butyl Carbitol acetate, and propylene glycol monomethyl ether acetate; alcohols such as ethanol, propanol, ethylene glycol, and propylene glycol; aliphatic hydrocarbons such as octane and decane; and petroleum solvents such as petroleum ether, petroleum naphtha, hydrogenated petroleum naphtha, and solvent naphtha. Each of different organic solvents may be used alone or in combination.

In Step (1), a film of the curable composition for nanoimprinting may be formed by applying the curable composition to the substrate according to a known procedure such as spin coating, slit coating, spray coating, or roller coating. The film (curable composition at coating) has a viscosity of preferably from about 1 mPa·s to about 10 Pa·s and more preferably from about 1 mPa·s to about 1000 mPa·s. The thus-formed film of the curable composition for nanoimprinting (film before curing) has a thickness of typically from about 0.01 to about 1 µm, and preferably from about 0.01 to about 0.5 µm.

The imprint stamp (nanostamper) for use in Step (2) may be a stamper which is a nanoimprinting-transfer stamp bearing a convexo-concave transfer pattern on its surface and is composed of a material such as a silicone, glass, or silica glass. Among such stampers, a silicone rubber stamper is advantageously usable for satisfactory releasability from the resin after pattern transfer. Independently, a finely patterned metallic mold may also be used as the imprint stamp herein.

The pattern transfer in Step (2) is performed by stamping or pressing the imprint stamp against the film at a pressure of from 10 kPa to 100 MPa for a duration of typically from about 0.01 to about 300 seconds and preferably from about 5 to about 150 seconds. The film after pattern transfer has a thickness of typically from about 50 to about 1000 nm and preferably from about 150 to about 500 nm.

The curing process in Step (3) is preferably conducted such that the nanostamper is left stand on the film. In a preferred embodiment, the method includes, as Steps (2) and (3), the step of stamping the nanostamper onto the film at a pressure of from 10 kPa to 100 MPa for 0.01 to 300 seconds (preferably 5 to 150 seconds) to transfer the pattern to the film, and simultaneously with this, applying heating and/or UV (ultraviolet ray) irradiation to the film to cure the film, to thereby yield a fine structure. The cured film after curing process has a thickness of typically from about 50 to about 1000 nm and preferably from about 150 to about 500 nm.

The film may be cured by a thermal curing process through heating, or an UV curing process through ultraviolet irradiation, or both in combination. The UV curing generally employs a transfer stamp having ultraviolet transparency. The thermal curing may be performed typically under such conditions as to heat the film at a temperature of from about 80° C. to about 150° C. for about 1 to about 10 minutes. The UV curing may be performed typically under conditions as to apply an ultraviolet ray to the film for about 5 to about 20 minutes.

After the film is cured by the curing process, the imprint stamp is removed according to necessity, and an imprinted fine structure (microstructure) is obtained.

An observation of the resulting fine structure under a scanning electron microscope reveals that the target substrate bears not only the imprinted fine structure but also an unstructured residual layer having a thickness of less than 30 nm. When the fine structure will be subsequently used in a microelectronic device, the residual layer should be removed for a steep wall slope and a high aspect ratio. To meet this requirement, the method preferably further includes the step of etching the cured film as Step (4).

The etching of the cured film (residual layer) in Step (4) may be conducted typically through dry etching with oxygen plasma or a $CHF_3/O_2$ gas mixture. The etching may also be conducted through wet etching with an organic solvent (e.g., tetrahydrofuran) and/or an alkaline developer. Wet etching is easily performed according to the present invention, because the cured film is readily soluble in an organic solvent and/or an alkaline developer.

After etching, the resist coated film (resist film) may be removed typically using an organic solvent (e.g., tetrahydrofuran) and/or tetramethylammonium hydroxide.

The fine structure may further be subjected to one or more suitable processes according to the type thereof so as to have desired properties.

The method according to the present invention may further include the step of forming on the resulting fine structure a second structure from another material than that of the fine structure and subsequently removing the fine structure to yield a three-dimensional fine structure, as Step (5). Such a three-dimensional fine structure may be easily produced by the above method according to the present invention, because the cured film is satisfactorily releasable from a mold (particularly from a structure composed of a material different therefrom).

The removal of the fine structure may be conducted by dissolving the fine structure in a solvent or alkaline developer which dissolves not the second structure but the fine structure therein. According to the present invention, such a three-dimensional fine structure may be easily prepared, because the cured film is readily soluble in an organic solvent and/or alkaline developer.

The method according to the present invention enables efficient producing of a finely-patterned fine structure which excels in curability, transferability, and mold releasability, has satisfactory solubility in a solvent and/or alkaline developer, and can thereby be produced even in mass production through nanoimprinting technologies. The method also enables simple and easy producing of a three-dimensional fine structure. The resulting fine structures are useful typically as materials for semiconductor devices, materials for micro-electric-mechanical systems, flat screens, holograms, waveguides, precision machinery components, sensors, and molds for the production of replica molds.

EXAMPLES

The present invention will be illustrated in further detail with reference to several working examples below. It should be noted, however, that these examples are never construed to limit the scope of the present invention.

Preparation Example 1

Synthesis of Polymer (A-1)

Cyclohexanone (125 g) was fed into a 1-liter separable flask equipped with a stirrer, a thermometer, a reflux condenser, dropping funnels, and a nitrogen inlet tube, and heated to 95° C., to which 150 g of dicyclopentanyl methacrylate ("FA-513M" supplied by Hitachi Chemical. Co., Ltd.), 6 g of 2,2'-azobis(2-methylbutyronitrile) ("ABN-E" supplied by Japan Hydrazine Co., Inc. (now Japan Finechem Company, Inc.)), and 212 g of cyclohexanone were added dropwise together over 3 hours. After the dropwise addition, the mixture was aged for 4 hours and thereby yielded a target Polymer (A-1). The resulting polymer had a glass transition temperature Tg of 175° C.

Preparation Example 2

Synthesis of Polymer (A-2)

Cyclohexanone (125 g) was fed into a 1-liter separable flask equipped with a stirrer, a thermometer, a reflux condenser, dropping funnels, and a nitrogen inlet tube and heated to 95° C., to which 138 g of dicyclopentanyl methacrylate ("FA-513M" supplied by Hitachi Chemical Co., Ltd.), 12.2 g of methacrylic acid, 4 g of 2,2'-azobis(2-methylbutyronitrile) ("ABN-E" supplied by Japan Hydrazine Co., Inc. (now Japan Finechem Company, Inc.)), and 212 g of cyclohexanone were added dropwise together over 3 hours. After the dropwise addition, the mixture was aged for 4 hours and thereby yielded a target Polymer (A-2). The resulting polymer had a glass transition temperature Tg of 140° C. and an acid value (acid number) of 60 KOH-mg/g.

Preparation Example 3

Synthesis of Polymer (A-3)

Propylene glycol monomethyl ether ("MMPG" supplied by Daicel Chemical Industries, Ltd.) (300 g) was fed into a 2-liter separable flask equipped with a stirrer, a thermometer, a reflux condenser, dropping funnels, and a nitrogen inlet tube, and heated to 110° C., to which 151 g of methacrylic acid, 110 g of methyl methacrylate, 200 g of MMPG, and 28.7 g of t-butyl peroxy-2-ethylhexanoate ("PERBUTYL O" supplied by NOF Corporation) were added dropwise together over 3 hours. After the dropwise addition, the mixture was aged for 4 hours and thereby synthetically yielded a trunk polymer containing carboxyl groups. Next, the trunk polymer solution was combined with 239 g of 3,4-epoxycyclohexylmethyl acrylate ("CYCLOMER A200" supplied by Daicel Chemical Industries, Ltd.), 2.4 g of triphenylphosphine, and 1.0 g of methylhydroquinone, followed by a reaction at 100° C. for 10 hours. The reaction was performed in an atmosphere of mixture of air and nitrogen. This gave a target Polymer (A-3). The resulting polymer had a glass transition temperature Tg of 105° C., an acid value of 50 KOH-mg/g, and a double-bond equivalent (resin weight per 1 mol of unsaturated group) of 381.

Examples 1 to 12, Comparative Examples 1 to 4

Preparation of Film

A series of curable compositions for nanoimprinting was prepare by blending in a flask a resin, a monomer or monomers, and an initiator in the types and amounts (parts by weight) given in a table below, and a solvent (cyclohexanone) in such an amount as to give a solids content of 30 percent by weight. Specific compounds used as the respective components in the table are as follows.

Resin
A-1: Polymer obtained from Preparation Example 1
A-2: Polymer obtained from Preparation Example 2
A-3: Polymer obtained from Preparation Example 3

Monomer
B-1: EA-513M (supplied by Hitachi Chemical Co., Ltd.), dicyclopentanyl methacrylate)
B-2: FA-513A (supplied by Hitachi Chemical Co., Ltd.), dicyclopentanyl acrylate)
B-3: FA-512A (supplied by Hitachi Chemical Co., Ltd.), dicyclopentenyloxyethyl acrylate)
B-4: FA-512M (supplied by Hitachi Chemical Co., Ltd.), dicyclopentenyloxyethyl methacrylate)
B-5: p-Hydroxystyrene
B-6: βCEA (supplied by Daicel-Cytec Co., Ltd., (β-carboxyethyl acrylate)
B-7: MAA (supplied by Nippon Shokubai Co, Ltd., methacrylic acid)
B-8: BA (butyl acrylate)
B-9: 2VP (supplied by Nippon Shokubai Co, Ltd., 2-vinylpyrrolidone)
B-10: 4EO-A (supplied by Osaka Organic Chemical Industry Ltd., polyethylene glycol diacrylate)
B-11: TMPTA (trimethylolpropane triacrylate)

Initiator
C-1: "Irgacure 907" supplied by Ciba Specialty Chemicals Corporation

Each of the resulting curable compositions for nanoimprinting was applied to a 4-inch silicon wafer, which had been pretreated with hexamethyldisilazane, by spin coating at 3000 revolutions for 30 seconds and thereby yielded a film thereon. Next, the film was subjected to a drying process for the removal of the solvent by heating at about 80° C. for 5 minutes. The film after drying had a thickness of about 200 nm.

An imprinter used herein was a computerized tester ("Model NM-0401" supplied by Meisho Kiko Co.). This apparatus is capable of maintaining a predetermined pressure for a specific duration by programming conditions or parameters such as loading, relaxation rate, and heating temperature. Nanoimprinting was performed on the film as examples and comparative examples using a transfer imprint stamp bearing a 200-nm line-and-space pattern under the conditions given in the table below (stamping pressure: 2 MPa, stamping temperature: 25° C., stamping time: 60 sec).

Next, while the transfer imprint stamp was being in contact with the film, a curing process was applied to the film by applying ultraviolet radiation (ultraviolet ray exposure energy: 1 J/cm$^2$) to the film using an attached high-pressure mercury lamp and thereby yielded a cured product bearing a fine pattern. The both ends of the pattern, the rectangular shapes of the pattern edges, and the nanostructure (fine structure) having a wall slope of about 90° were observed under a scanning electron microscope, and properties or conditions of the nanostructure were evaluated based on the observed dimensions. The evaluation results are shown in the table below.

Evaluations (Coatability)

A sample curable composition was applied to a silicon wafer by spin coating to give a coated film, and the surface of the coated film was observed to find whether a uniform coated film was formed.

A: A uniform film was obtained.

C: Crawling of the coated film was observed after spin coating.

(Curability)

After imprinting, the surface of a sample film was observed to determine whether the film was cured or not.

A: The film was uniformly cured.

B: The film was cured but showed unevenness.

C: The film showed stickiness and was not cured.

(Transferability)

After the transfer imprint stamp was removed, the formed pattern was observed under a scanning electron microscope to observe the appearance of the pattern.

A: Pattern edges and pattern ends retained rectangular shapes.

B: Pattern edges and pattern ends were curved.

C: Pattern surfaces at both ends of the film shrank with peeling.

(Releasability from Transfer Imprint Stamp)

A sample coated film after exposure and curing was to be removed from the transfer imprint stamp, and at this time, the releasability of the film was observed.

A: The film could be easily removed merely by touching the imprint stamp.

B: The film could be removed by impressing a force upon the imprint stamp.

C: The film could not be easily removed bare-handed.

(Solvent Solubility)

After removing the transfer imprint stamp, the formed pattern was immersed in a solvent (THF; tetrahydrofuran), and the appearance of the pattern was observed. Likewise, the formed pattern was immersed in an aqueous alkali solution [2.38 percent by weight aqueous TMAH (tetramethylammonium hydroxide) solution], and the appearance of the pattern was observed.

A: The pattern was thoroughly dissolved within 10 to 20 seconds.

B: The pattern was almost dissolved 2 minutes later but partially included undissolved residual matter.

C: The pattern was not dissolved at all.

The glass transition temperature Tg (° C.) in the table represents a glass transition temperature Tg as calculated from the copolymer of corresponding monomers. When a multifunctional acrylate was used as part of monomers, the glass transition temperature Tg represents a glass transition temperature Tg (estimate) of a polymer formed from the other monomers than the multifunctional acrylate.

TABLE 1

| | | Ex. 1 | Ex. 2 | Ex. 3 | Ex. 4 | Ex. 5 | Ex. 6 | Ex. 7 | Ex. 8 | Ex. 9 | Ex. 10 | Ex. 11 | Ex. 12 | Com. Ex. 1 | Com. Ex. 2 | Com. Ex. 3 | Com. Ex. 4 |
|---|---|---|---|---|---|---|---|---|---|---|---|---|---|---|---|---|---|
| | | | | | | Nanoimprinting composition | | | | | | | | | | | |
| Resin | A-1 | | 9.5 | 9 | 9 | | 30 | | 5 | | | | | 10 | | 9 | |
| | A-2 | | | | | 20 | | 15 | 5 | 10 | 10 | 10 | 10 | | 10 | | |
| | A-3 | | | | | | | | | | | | | | | | 10 |
| Monomer | B-1 | 100 | 90.5 | | | | 55 | | 10 | | | | 20 | | | 70 | |
| | B-2 | | | 81 | 81 | 70 | | 65 | 70 | 60 | 70 | 70 | | | | | 40 |
| | B-3 | | | 10 | | | | | | | | | | 80 | | | |
| | B-4 | | | | 10 | | 10 | | 5 | | | | | | | | |
| | B-5 | | | | | | | | | | 30 | | | | | | |
| | B-6 | | | | | | | 5 | | | 20 | | | | 20 | | |
| | B-7 | | | | | | | 20 | | | | 20 | | | | | |
| | B-8 | | | | | 5 | | | | | | | | 10 | 70 | | 20 |
| | B-9 | | | | | | | | | | | | 70 | | | | |
| | B-10 | | | | | 5 | | | | | | | | | | | 30 |
| | B-11 | | | | | | | | | | | | | | | 30 | |
| | Tg | 175 | 175 | 104 | 110 | 132 | 148 | 141 | 114 | 88 | 98 | 140 | 175 | 10 | −4 | 175 | 62 |
| Initiator | C-1 | 3 | 3 | 3 | 3 | 3 | 3 | 3 | 3 | 3 | 3 | 3 | 3 | 3 | 3 | 3 | 3 |
| Solids content | % | 30 | 30 | 30 | 30 | 30 | 30 | 30 | 30 | 30 | 30 | 30 | 30 | 30 | 30 | 30 | 30 |
| | | | | | | Imprinting conditions | | | | | | | | | | | |
| Stamping pressure | MPa | 2 | 2 | 2 | 2 | 2 | 2 | 2 | 2 | 2 | 2 | 2 | 2 | 2 | 2 | 2 | 2 |
| Stamping temperature | ° C. | 25 | 25 | 25 | 25 | 25 | 25 | 25 | 25 | 25 | 25 | 25 | 25 | 25 | 25 | 25 | 25 |
| Stamping time | Sec | 60 | 60 | 60 | 60 | 60 | 60 | 60 | 60 | 60 | 60 | 60 | 60 | 60 | 60 | 60 | 60 |
| UV exposure | J/cm$^2$ | 1 | 1 | 1 | 1 | 1 | 1 | 1 | 1 | 1 | 1 | 1 | 1 | 1 | 1 | 1 | 1 |
| | | | | | | Evaluation results | | | | | | | | | | | |
| Coatability | | B | A | A | A | A | A | A | A | A | A | A | A | A | A | A | A |
| Curability | | A | A | A | A | A | A | A | A | A | A | A | A | B | A | A | A |
| Transferability | | A | A | A | A | A | A | A | A | A | A | A | A | B | C | A | C |
| Releasability | | A | A | A | A | A | A | A | A | A | A | A | A | C | C | A | C |
| Solubility | | | | | | | | | | | | | | | | | |
| Solvent | THF | A | A | A | A | A | A | A | A | C | C | C | C | A | C | C | C |
| Aqueous alkali solution | 2.38% TMAH | C | C | C | C | C | C | C | C | A | A | A | A | C | A | C | C |

The table demonstrates that curable compositions for nanoimprinting according to the present invention excel in transferability and give cured products which have satisfactory releasability and are readily soluble in a solvent (THF) or a 2.38 percent by weight aqueous TMAH (tetramethylammonium hydroxide) solution as an aqueous alkali solution.

Example 13

A composition for imprinting was prepared by mixing 10 g of Polymer A-1, 90 g of Monomer B-1, and an initiator Irg 907 (Irgacure 907) in an amount of 5 percent by weight based on the total weight, to give a mixture; and filtering the mixture through a 0.05-micron mesh filter. The prepared curable composition for imprinting was dropped onto a polyethylene terephthalate) (PET) film; using the imprinter, a quartz master mold having a 200- to 1000-nm line-and-space and 500-nm nanopillar structure was placed on the applied curable composition; the transfer pressure was increased to a pressure of 1 MPa over 30 seconds; and, while maintaining the transfer pressure, an ultraviolet ray was applied from the quartz mold side to cure the composition for imprinting. The master mold was removed, and thereby a fine-structure pattern composed of the cured product for nanoimprinting was obtained on the PET film. Independently, a nanoimprinting material (NIAC 34; radically curable) supplied by Daicel Chemical Industries, Ltd. was applied to a glass substrate by spin coating, and prebaked at 85° C. for 30 seconds, onto which the fine pattern formed on the PET film was transferred using the imprinter. After transferring, the PET film was removed, the cured product for nanoimprinting, being soluble in a solvent, was dissolved through immersion in cyclohexanone, and thereby a replica mold was prepared. Observations of the pattern dimensions of the prepared replica mold and the dimensions of the master mold under an atomic force microscope (AFM) revealed that the prepared replica mold had pattern dimensions substantially equivalent to those of the master mold.

Example 14

A fine-structure pattern was formed on a PET film by the procedure of Example 13. Next, a nanoimprinting material (NIHB 34; a hybrid material being both radically curable and cationically curable) supplied by Daicel Chemical Industries, Ltd. was applied to a glass substrate by spin coating, to which the fine pattern formed on the PET film was transferred using the imprinter. After transferring, the PET film was removed, the cured product for nanoimprinting, being soluble in a solvent, was dissolved by immersing in cyclohexanone, and a replica mold was thus prepared. Observations of the pattern dimensions of the prepared replica mold and the dimensions of the master mold under an atomic force microscope (AFM) revealed that the prepared replica mold had pattern dimensions substantially equivalent to those of the master mold.

Example 15

A fine-structure pattern was formed on a PET film by the procedure of Example 13. Next, a nanoimprinting material (NICT 39; cationically curable) supplied by Daicel Chemical Industries, Ltd. was applied to a glass substrate by spin coating, to which the fine pattern formed on the PET film was transferred using the imprinter. After transferring, the PET film was removed, and there was found a solvent-developable resin (fine-structure pattern composed of the cured product for nanoimprinting) on the PET film. Thus, a replica mold was prepared without dissolving the solvent-soluble cured product for nanoimprinting. Observations of the pattern dimensions of the prepared replica mold and the dimensions of the master mold under an atomic force microscope (AFM) revealed that the prepared replica mold had pattern dimensions substantially equivalent to those of the master mold.

INDUSTRIAL APPLICABILITY

The curable compositions for nanoimprinting according to the present invention excel in curability, transferability, and mold releasability, have satisfactory solubility in a solvent and/or an alkaline developer, enable mass production according to nanoimprinting technologies, and enable efficient production of fine structures each bearing a fine pattern. The curable compositions also enable easy and simple production of three-dimensional fine structures. The resulting fine structures are useful typically as materials for semiconductor devices, materials for micro-electric-mechanical systems (MEMS), flat screens, holograms, waveguides, precision machinery components, sensors, or molds for the production of replica molds.

The invention claimed is:

1. A curable composition for nanoimprinting, comprising two or more polymerizable monomers,
   wherein the two or more polymerizable monomers includes 90 percent by weight or more of two or more monofunctional radically polymerizable monomers,
   the two or more monofunctional radically polymerizable monomers give a polymer having a glass transition temperature of 25° C. or higher,
   the two or more monofunctional radically polymerizable monomers are at least two compounds selected from the group consisting of (meth)acrylic ester compounds, styrenic compounds, and vinyl ether compounds,
   the two or more monofunctional radically polymerizable monomers include at least one radically polymerizable monomer intramolecularly having a cyclic structure as the monofunctional radically polymerizable monomers,
   the at least on radically polymerizable monomer intramolecularly having a cyclic structure is at least one compound selected from the group consisting of compounds represented by following Formulae (1) to (3):

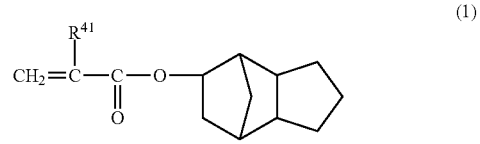

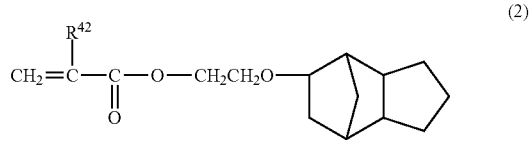

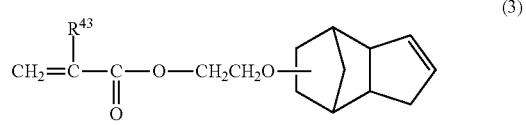

wherein $R^{41}$, $R^{42}$, and $R^{43}$ are the same as or different from one another and each represent —H or —CH$_3$, the at least one radically polymerizable monomer intramolecularly having a cyclic structure occupies 40 percent by weight or more of the total weight of the polymerizable monomers in the curable composition, with the proviso that the at least on radically polymerizable monomer intramolecularly having a cyclic structure includes a compound represented by Formula (1), the compound represented by Formula (1) occupies 40 percent by weight or more of the total weight of the polymerizable monomers, and at least one of the following conditions A, B, and C is met:

[A] the total weight of the compound represented by Formula (1) and the compound represented by Formula (3) occupies 90 percent by weight or more of the total weight of the polymerizable monomers;

[B] the total weight of the compound represented by Formula (1) and (meth)acrylic acid alkyl esters whose alkyl moiety has 1 to 10 carbon atoms occupies 90 percent by weight or more of the total weight of the polymerizable monomers;

[C] the total weight of the compound represented by Formula (1) and/or (3) and phenolic-hydroxyl-containing monofunctional radically polymerizable monomers and/or caboxyl-containing monofunctional radically polymerizable monomers occupies 90 percent by weight or more of the total weight of the polymerizable monomers, and the total weight of the phenolic-hydroxyl-containing monofunctional radically polymerizable monomers and the carboxyl-containing monofunctional radically polymerizable monomers occupies 10 percent by weight or more of the total weight of the polymerizable monomers.

2. The curable composition for nanoimprinting according to claim 1, further comprising at least one polymer being obtained through polymerization of one or more monofunctional radically polymerizable monomers and having a glass transition temperature of 25° C. or higher.

3. The curable composition for nanoimprinting according to claim 1, further comprising at least one radical-polymerization initiator.

4. The curable composition for nanoimprinting according to claim 1, wherein the at least one radically polymerizable monomer intramolecularly having a cyclic structure includes at least one compound represented by Formula (2) or (3).

5. The curable composition for nanoimprinting according to claim 1 or 4, wherein one or more monomers selected from the group consisting of phenolic-hydroxyl-containing monofunctional radically polymerizable monomers, carboxyl-containing monofunctional radically polymerizable monomers, and heterocyclic-group-containing monofunctional radically polymerizable monomers occupies 10 percent by weight or more of the total weight of polymerizable monomers in the curable composition.

* * * * *